United States Patent
Yamakage

(10) Patent No.: US 11,510,353 B2
(45) Date of Patent: Nov. 22, 2022

(54) MOUNTING ACCURACY MEASUREMENT CHIP AND MOUNTING ACCURACY MEASUREMENT KIT

(71) Applicant: FUJI CORPORATION, Chiryu (JP)

(72) Inventor: Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/967,658

(22) PCT Filed: Feb. 12, 2018

(86) PCT No.: PCT/JP2018/004758
§ 371 (c)(1),
(2) Date: Aug. 5, 2020

(87) PCT Pub. No.: WO2019/155643
PCT Pub. Date: Aug. 15, 2019

(65) Prior Publication Data
US 2021/0243926 A1    Aug. 5, 2021

(51) Int. Cl.
*H05K 13/08*    (2006.01)

(52) U.S. Cl.
CPC ....... *H05K 13/0882* (2018.08); *H05K 13/089* (2018.08)

(58) Field of Classification Search
CPC . H05K 13/0882; H05K 13/089; H05K 13/087
See application file for complete search history.

(56) References Cited

U.S. PATENT DOCUMENTS

| 5,237,622 | A | * | 8/1993 | Howell | ............... | H05K 13/089 |
|  |  |  |  |  |  | 356/243.1 |
| 5,247,844 | A | * | 9/1993 | Howell | ............... | H05K 13/089 |
|  |  |  |  |  |  | 73/865.8 |

(Continued)

FOREIGN PATENT DOCUMENTS

| DE | 4227667 A1 | * | 2/1994 | ............. H05K 13/08 |
| JP | 11-54999 A |   | 2/1999 | |

(Continued)

OTHER PUBLICATIONS

International Search Report dated Apr. 10, 2018 in PCT/JP2018/004758 filed Feb. 12, 2018.

*Primary Examiner* — Jeffrey T Carley
(74) *Attorney, Agent, or Firm* — Oblon, McClelland, Maier & Neustadt, L.L.P.

(57) ABSTRACT

A mounting accuracy measurement chip includes a chip main body; and one or more protrusions provided on a mounting face of the chip main body, which serve as a contact surface with a mounting target at a position shifted from the mounting face of the chip main body. The one or more protrusions are disposed only within a range defined by a circle whose center is center of gravity of the mounting face and whose radius is half the length of the longest distance from center of gravity to the outer edge of chip main body. Further, a mounting accuracy measurement kit includes the above-mentioned mounting accuracy measurement chip and placement portion, having a degree of adhesiveness, to which the contact surface of mounting accuracy measurement chip, which can be placed, adheres.

4 Claims, 5 Drawing Sheets

(56) References Cited

U.S. PATENT DOCUMENTS

| | | | | |
|---|---|---|---|---|
| 5,477,160 A * | 12/1995 | Love | ............... | G01R 1/07314 |
| | | | | 324/756.02 |
| 6,018,865 A * | 2/2000 | Michael | ............ | H05K 13/0413 |
| | | | | 29/740 |
| 6,050,151 A * | 4/2000 | Larson | ............... | H05K 13/089 |
| | | | | 73/865.9 |
| 6,064,219 A * | 5/2000 | Aigner | ............... | G01R 31/2818 |
| | | | | 324/762.05 |
| 6,563,530 B1 * | 5/2003 | Oyama | ............ | H05K 13/0818 |
| | | | | 348/87 |
| 7,102,148 B2 * | 9/2006 | Kodama | ............ | H05K 13/0452 |
| | | | | 250/559.44 |
| 7,525,201 B2 * | 4/2009 | Takahira | ............... | H01L 24/81 |
| | | | | 257/E23.179 |
| 10,945,360 B2 * | 3/2021 | Sugita | ............... | H05K 13/0417 |
| 2009/0025961 A1 * | 1/2009 | Kanemaru | ............... | H01L 24/19 |
| | | | | 174/250 |
| 2013/0307636 A1 * | 11/2013 | Kimbara | ............... | H03H 9/0542 |
| | | | | 333/133 |

FOREIGN PATENT DOCUMENTS

| | | | | |
|---|---|---|---|---|
| JP | 11-220300 A | 8/1999 | | |
| JP | 2001-136000 A | 5/2001 | | |
| JP | 2008-205134 A | 9/2008 | | |
| JP | 2013-162082 A | 8/2013 | | |
| WO | WO-0015016 A2 * | 3/2000 | ........... | H05K 13/089 |

* cited by examiner

MOUNTING ACCURACY MEASUREMENT CHIP AND MOUNTING ACCURACY MEASUREMENT KIT

TECHNICAL FIELD

The present specification discloses a mounting accuracy measurement chip used for measuring the mounting accuracy of a mounting device and a mounting accuracy measurement kit including the mounting accuracy measurement chip.

BACKGROUND ART

Patent Literature 1 and 2 describe a mounting device for mounting a mounting member to a target mounting substrate. In mounting devices, various methods have been conventionally used to mount a mounting member at a set position on a target mounting substrate with high accuracy. Cited Literature 1 and 2 describe the detection of a mounting position error in a mounting device to improve the mounting accuracy of a mounting device. In order to measure the mounting position error, an inspection chip is mounted on a substrate by a mounting device, the mounted inspection chip is imaged with a camera, and the imaging result is compared with a reference position.

Cited Literature 1 to 4 describe the inspection chip, that is, a mounting accuracy measurement chip used to measure the mounting accuracy of a mounting device. Further, cited Literature 1 describes a mounting accuracy measurement kit configured to include a mounting accuracy measurement chip and a placement portion on which the chip is placed when measuring mounting accuracy.

Patent Literature

Patent Literature 1: JP-A-2008-205134
Patent Literature 2: JP-A-2001-136000
Patent Literature 3: JP-A-H11-54999
Patent Literature 4: JP-A-H11-220300

BRIEF SUMMARY

Technical Problem

It is, of course, desirable to have high accuracy for the mounting accuracy measurement of the mounting device. Further, in the mounting accuracy measurement kit described above, the placement portion has a degree of adhesiveness causing the mounting accuracy measurement chip to adhere to the placement portion, and the chip needs to be peeled off from the placement portion after measurement of the mounting accuracy. However, it is difficult to peel off the chip when the entire lower surface of the chip is adhered to the placement portion. By addressing such problems, it is expected that the mounting accuracy measurement chip and the mounting accuracy measurement kit will become more practical. It is an object of the present application to provide a mounting accuracy measurement chip and a mounting accuracy measurement kit that are highly practical.

Solution to Problem

In order to solve the above-mentioned problem, the present specification discloses a mounting accuracy measurement chip, comprising: a chip main body; and one or more protrusions, provided on a mounting face of the chip main body, which serve as a contact surface with a mounting target at a position shifted from the mounting face of the chip main body; wherein the one or more protrusions are disposed only within a range defined by a circle whose center is the center of gravity of the mounting face and whose radius is half the length of the longest distance from the center of gravity to the outer edge of the chip main body. Further, the present specification discloses a mounting accuracy measurement kit including the above-mentioned mounting accuracy measurement chip and a placement portion, having a degree of adhesiveness, to which the contact surface of the mounting accuracy measurement chip, which can be placed, adheres.

Advantageous Effects

In the case in which the entire lower face of the mounting accuracy measurement chip, without having protrusions, makes contact with a substrate, if, for example, the chip and the substrate are not parallel when being mounted on the substrate, the outer edge of the chip makes contact first and causes an error in the mounting position. On the other hand, in the mounting accuracy measurement chip disclosed in this specification, one or more protrusions are provided on the mounting face of the chip main body, and the one or more protrusions are only in the central vicinity of the center of gravity of the chip main body. That is, with the mounting accuracy measurement chip disclosed in this specification, when the chip is mounted on a substrate by a mounting device, the chip main body does not come in contact with the substrate and instead only one or more protrusions comes in contact with the substrate. Therefore, with the mounting accuracy measurement chip disclosed in this specification, it is possible to improve the measurement accuracy when measuring the mounting accuracy.

Further, in the mounting accuracy measuring kit disclosed in this specification, when the above-mentioned mounting accuracy measurement chip is placed on the placement portion, only the protrusions of the chip adhere to the placement portion, making it easy to detach the chip from the placement portion after the measurement. For example, it is possible to configure the mounting device to collect the mounting accuracy measurement chip mounted on the placement portion and return the mounting accuracy measurement chip to the pre-inspection position.

DESCRIPTION OF EMBODIMENTS

Hereinafter, a mounting accuracy measurement chip and a mounting accuracy measurement kit which comprise an embodiment of this disclosure will be described with reference to the figures. In addition to the following embodiment, various modifications can be made based on the knowledge of a person skilled in the art.

<Configuration of Component Mounting Machine>

Figure 1:
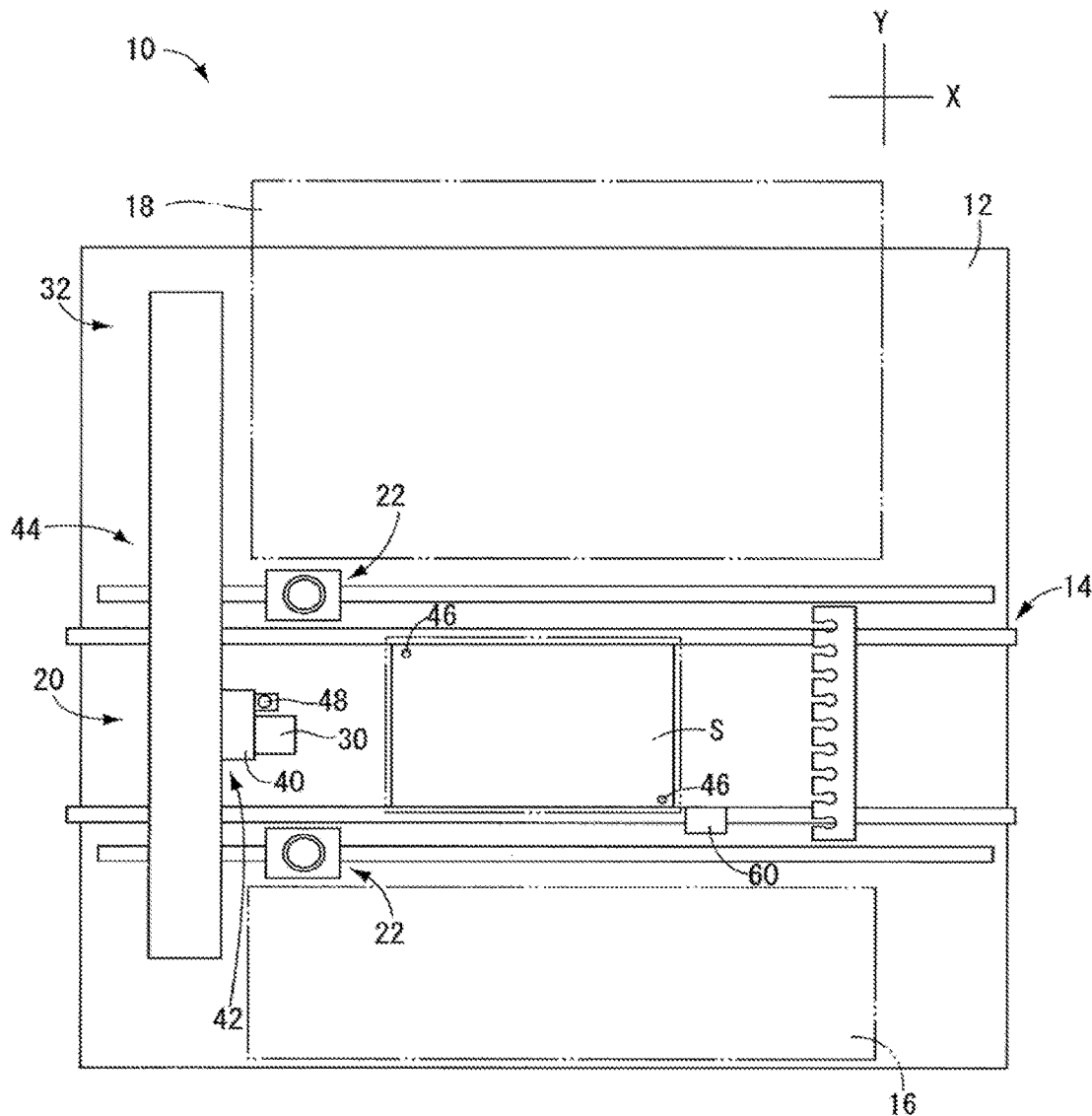
[FIG. 1] A plan view schematically showing a component mounting device provided with a mounting accuracy measurement kit of the embodiment.

FIG. 1 shows component mounting machine 10 provided with the mounting accuracy measurement kit of the present embodiment. The component mounting machine includes (a) base 12, (b) board conveyance and fixing device 14, disposed on based 12, for conveying in and conveying out circuit board S (hereinafter, referred to simply as "board S") and fixing the board to a predetermined position, (c) feeder-type component supply device 16 and tray-type component supply device 18 disposed on base 12 with board conveyance and fixing device 14 interposed there between, and (d) component mounting device 20 for mounting electronic components (hereinafter, referred to simply as "components") supplied from each of component supply devices 16, 18 to board S fixed by board conveyance and fixing device 14. Further, base 12 is provided with two part cameras 22. Each of two part cameras 22 is provided, in a movable manner, between feeder-type component feeder 16 and board conveyance and fixing device 14, and between tray-type component feeder 18 and board conveyance and fixing device 14, in parallel with the conveyance transport direction. Incidentally, in the following description, as indicated by an arrow in the figure, the conveyance direction of board S (the left-right direction in FIG. 1) may be referred to as the X-direction, and the direction perpendicular to the board conveyance direction may be referred to as the Y-direction.

Component mounting device 20 includes component mounting head 30, for holding the component and mounting the component, and head moving device 32, for moving component mounting head 30. Head moving device 32 includes head mounting body 40 to which component mounting head 30 is detachably attached, Y-direction moving mechanism 42 for moving head mounting body 40 over component feeding device 16, 18 and board S, X-direction moving mechanism 44 for moving Y-direction moving mechanism 42 in the X-direction. Further, although not shown, head mounting body 40 is configured to include a head lifting and lowering device, and component mounting head 30 is configured to be lifted and lowered by the head lifting and lowering device. Further, mark camera 48 for imaging reference mark 46 on the face of board S is fixed on head mounting body 40. Component mounting head 30, although not described in detail, is provided with suction nozzles, and the suction nozzles hold components by suction by supplying negative pressure and releases components by stopping the supply of negative pressure. Further, each suction nozzle is rotatable around an axis such that the rotational position is also adjusted at the time of component mounting.

<Overview of Component Mounting Work by Component Mounting Machine>

To describe the component mounting work by component mounting machine 10 of this embodiment, first, board S to be subjected to the work is conveyed from the upstream side by board conveyance and fixing device 14 and then fixed at a predetermined work position. Mark camera 48 is then moved by head moving device 32 and images reference mark 46 attached to the upper face of board S. A coordinate system that will serve as a reference for the mounting position is set based on the imaging data obtained by the imaging.

Subsequently, component mounting head 30 is positioned above multiple feeder-type component supply devices 16 or tray-type component supply device 18 by head moving device 32 and a component is held to each of the suction nozzles. During the time in which component mounting head 30 passes over part camera 22 on the way to the location above board S, a component held by a suction nozzle is imaged by part camera 22. Based on the imaging data, the positional deviation amount and the rotational positional deviation amount with respect to the nozzle axis of the component can be determined. Next, component mounting head 30 is moved above board S, and while corrections are performed based on the deviation amounts, each component is sequentially mounted at a set position defined by a mounting program. Component mounting head 30 reciprocates between component feeding devices 16, 18 and board S a number of times defined by the mounting program, and component mounting work by component mounting machine 10 is completed by component mounting head 30 repeating the holding and mounting of components as described above.

<Mounting Accuracy Measurement Chip and Mounting Accuracy Measurement Kit>

In component mounting machine 10 of this embodiment, it is possible to inspect the mounting accuracy of component mounting device 20. The mounting work on circuit board S of components described above is performed while performing corrections based on mounting position error, which result from the inspection, so that the mounting work is accurately performed.

Figure 2A:
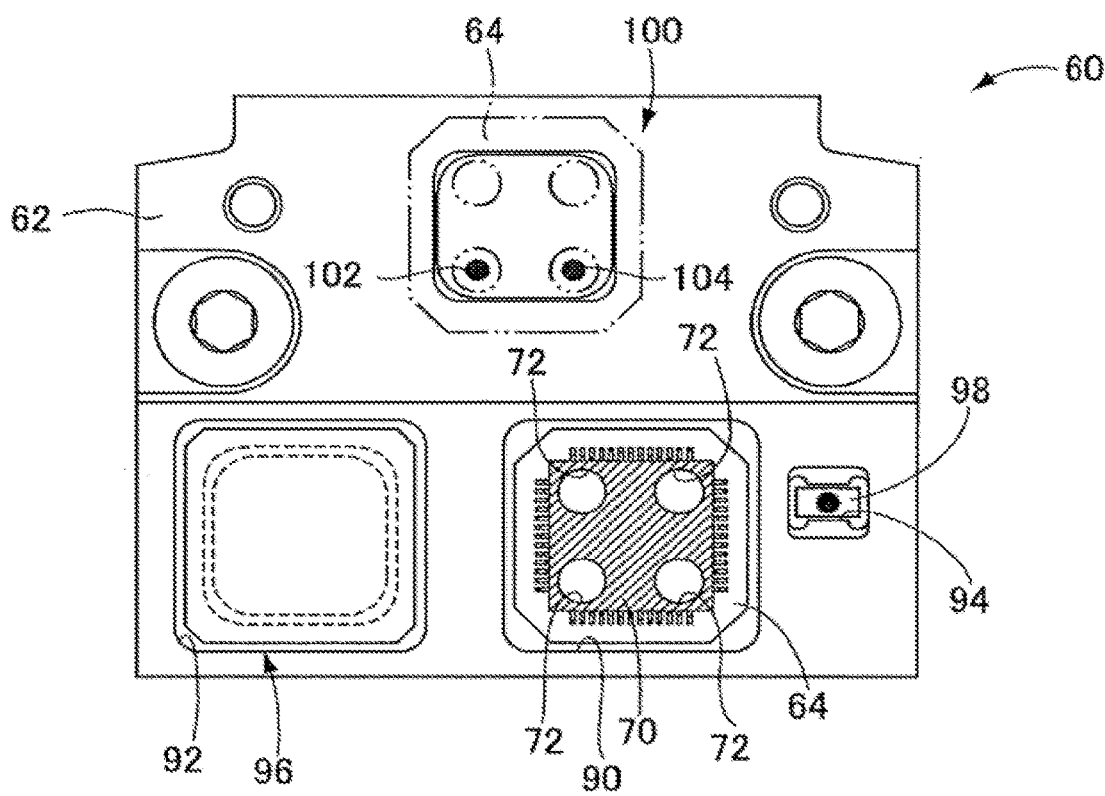
[FIG. 2] (a) A plan view and (b) a side view showing the mounting accuracy measurement kit of the embodiment.
Figure 2B:
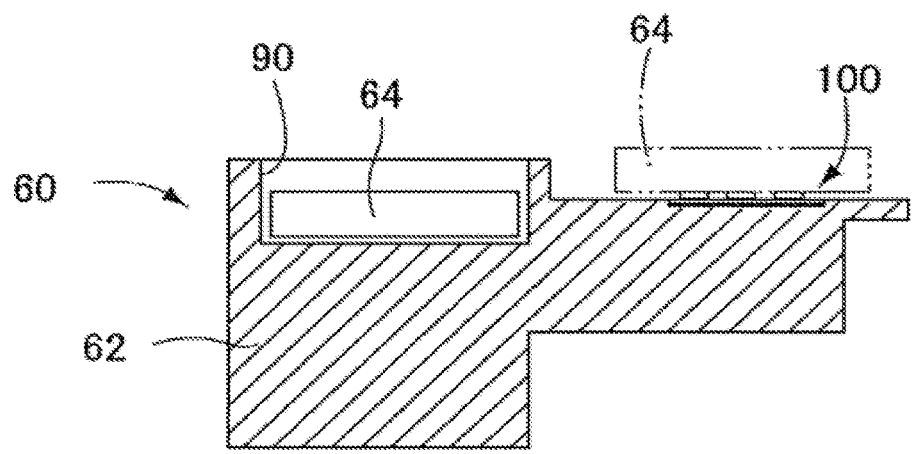
Figure 3:
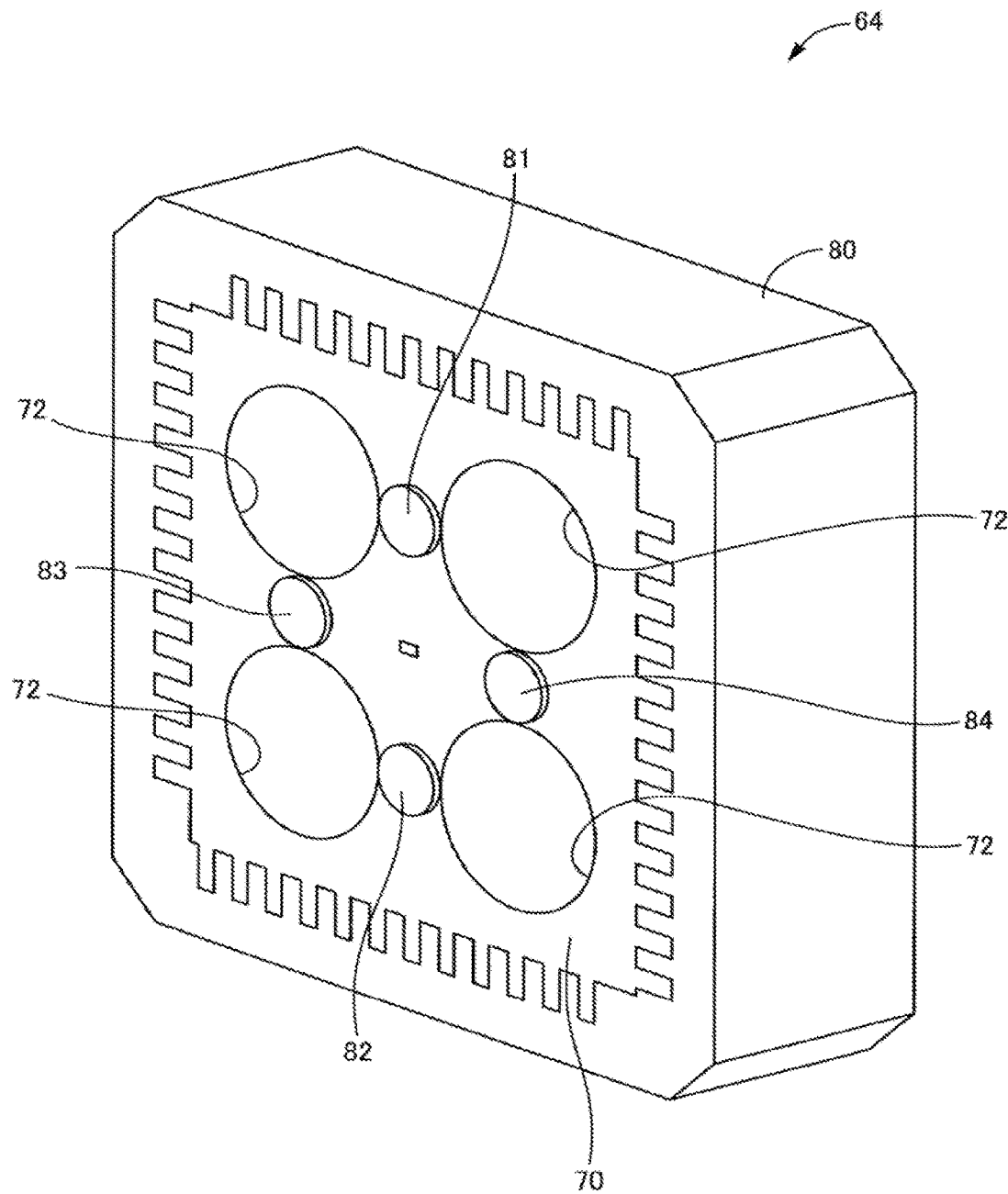
[FIG. 3] A perspective view of the mounting accuracy measurement chip of the embodiment.

In order to measure the mounting position error of component mounting device 20, component mounting machine 10 is provided with mounting accuracy measurement kit 60 of the present embodiment (hereinafter, sometimes referred to simply as "measurement kit 60"). Specifically, measurement kit 60 is fixed so as to be positioned outside of board conveyance and fixing device 14, as shown in FIG. 1. As shown in FIG. 2 and FIG. 3, measurement kit 60 includes measurement table 62 and mounting accuracy measurement chip 64 of the present embodiment (hereinafter, referred to simply as "measurement chip 64").

Measurement chip 64, as shown in FIG. 3, has a general square shape and is an image display chip showing shape 70 of the electronic circuit component such that multiple leads extend from each of the four sides. Although measurement chip 64 may be made of a metal such as stainless steel, ceramic, synthetic resin, or the like, and is not limited to any particular material, since it is desirable to for the chip to be made of a material having a small thermal expansion coefficient, in this embodiment, measurement chip 64 is made of colorless transparent glass. Further, measurement chip 64 has a size corresponding to a relatively large electronic circuit component having, for example, a 7 mm to 10 mm square.

Shape 70 formed on measurement chip 64, for example, is formed by aluminum vapor deposition, has a silver color, and is opaque. Four transparent windows 72 are formed in the portion of measurement chip 64 where shape 70 is formed. Each of four transparent windows 74 is a circular transparent portion. That is, opaque shape 70 is formed leaving four transparent windows 72. It should be noted that four transparent windows 72 are provided so that two adjacent windows are arranged in parallel with the outer edge of measurement chip 64, and the distance between two adjacent windows is equal.

Further, with respect to chip main body 80, in measurement chip 64, having a general square shape as described above, the mounting face of chip main body 80 is provided with four protrusions including first protrusion 81, second protrusion 82, third protrusion 83, and fourth protrusion 84. Each of four protrusions 81, 82, 83, 84 is a resin printed in the form of a regular circle by screen printing. The thickness of each of four protrusions 81, 82, 83, 84, in other words, in the comparatively large measurement chip 64, the protrusion margin is desirably 20 µm to 100 µm, and can be, for example, 40 µm.

Each of four protrusions 81, 82, 83, 84 is provided between two adjacent transparent windows 72 among the four transparent windows 72. Therefore, in measurement chip 64, each of four protrusions 81, 82, 83, 84 is provided so that first protrusion 81 and second protrusion 82 are positioned symmetrically with respect to the line segment connecting third protrusion 83 and fourth protrusion 84, and third protrusion 83 and fourth protrusion 84 are positioned symmetrically with respect to the line segment connecting first protrusion 81 and second protrusion 82.

Figure 4A:
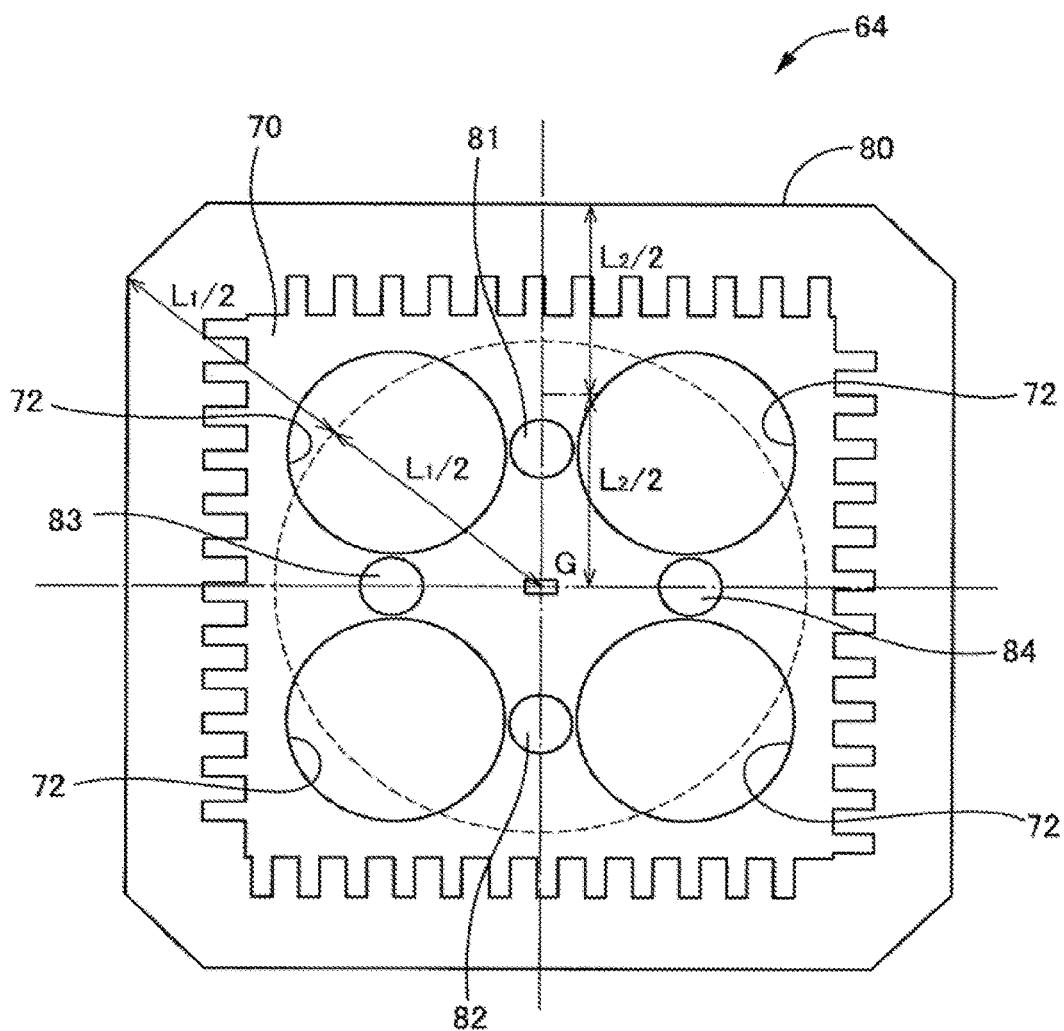
[FIG. 4] (a) A plan view and (b) a side view of the mounting accuracy measurement chip of the embodiment.
Figure 4B:
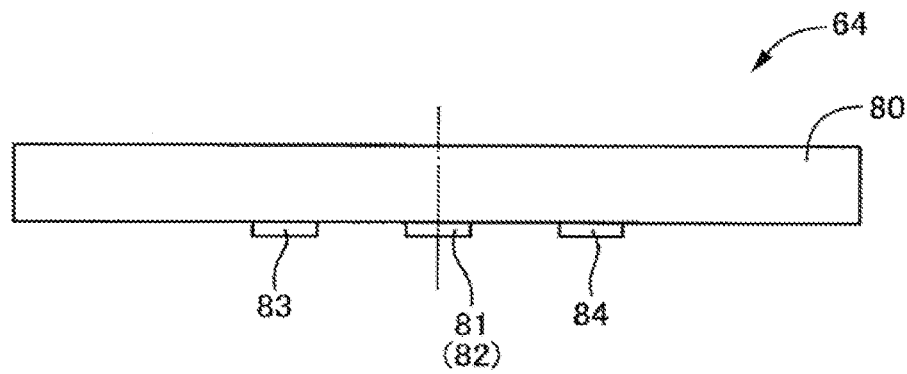

Four protrusions 81, 82, 83, 84 are disposed only in the central vicinity of chip main body 80. Specifically, four protrusions 81, 82, 83, 84 are only arranged within the range defined by a circle whose center is center of gravity G and whose radius is half the length of the longest distance L1 from center of gravity G to the outer edge of chip main body 80 (i.e., the range shown by dotted lines in FIG. 4(*a*)). Furthermore, in measurement chip 64, each of four protrusions 81, 82, 83, 84 are arranged on the center of gravity side from an intermediate position between the center of gravity and the outer edge.

On the other side, measuring table 62 has accommodation portion 90 slightly larger than measurement chip 64 and is longer in the depth direction than the thickness of measurement chip 64. Measurement chip 64 is accommodated in accommodation portion 90 so that the side on which four protrusions 81, 82, 83, 84 are formed is the lower side. Measurement table 62 has two accommodation portions 92 and 94 in addition to accommodation portion 90, and can accommodate other chips 96, 98 for inspection and measurement, although description thereof is omitted.

Further, measurement table 62, at the time of measuring the mounting accuracy, has placement portion 100 on which measurement chips 64, 96, 98 described above are placed and which is regarded as a component placement portion of a circuit board. Placement portion 100 is made to have a degree of adhesiveness and measurement chips 64, 96, 98 are adhered thereto. Two inspection reference marks 102, 104 are provided on placement portion 100. The two inspection reference mark 102, 104 are circles having a diameter smaller than the diameter of transparent windows 72 of measurement chip 64. The two inspection reference marks 102, 104 are provided side by side in the X-axis direction. The distance between the centers of the two inspection reference marks 102, 104 is made equal to the distance between the centers of two adjacent transparent windows 72. That is, when measurement chip 64 is placed on placement portion 100, it is possible to visually recognize inspection reference marks 102, 104 through transparent windows 72.

<Mounting Accuracy Measurement>

Next, a method of measuring the mounting accuracy of component mounting device 20 will be described, but since a detailed measurement method is described in, for example, the aforementioned Patent Literature 1 or the like, the description will be brief. First, component mounting head 30 is lowered by head moving device 32 while being moved above measurement chip 64 of mounting accuracy measurement kit 60, and measurement chip 64 is picked up from accommodation portion 90 and held by a suction nozzle. Next, component mounting head 30 is moved above part camera 22, and measurement chip 64 is imaged by part camera 22. The positional relationship between the suction nozzle and main measurement chip 64 held by the suction nozzle is determined based on the imaging data.

Component mounting head 30 is then moved again toward mounting accuracy measurement kit 60, and based on the positional relationship between the suction nozzle and measurement chip 64 described above, measurement chip 64 is placed on placement portion 100 (shown by a two-dot chain line in FIG. 2) so that the two transparent windows 72 of measurement chip 64 match with the two inspection reference marks 102, 104 of placement portion 100.

Figure 5A:
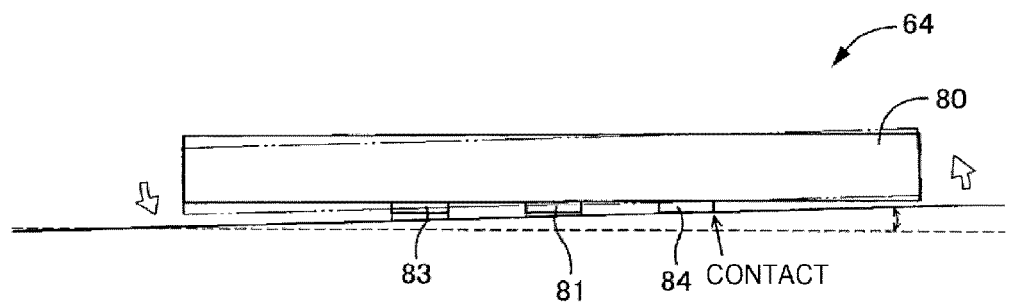
[FIG. 5] A side view schematically showing a state in which mounting accuracy measurement chip of the embodiment and a chip of a comparative example make contact with a placement portion of the mounting accuracy measurement kit.
Figure 5B:
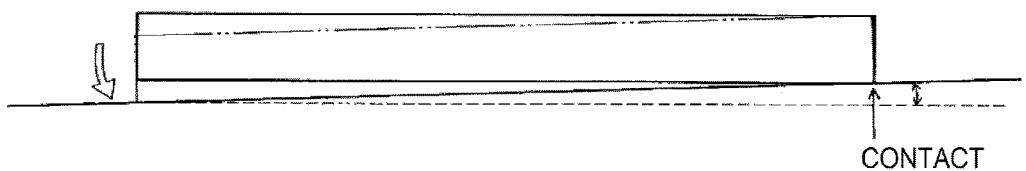

Incidentally, when protrusions 81, 82, 83, 84 are not provided to the measurement chip as in measurement chip 64, if the measurement chip and placement portion 100 are not horizontal when the measurement chip is placed on placement portion 100, the outer edge of the measurement chip will come in contact with placement portion 100, causing the measurement accuracy of the mounting position error to deteriorate. In contrast, measurement chip 64 is provided with four protrusions 81, 82, 83, 84 only in the central vicinity of chip main body 80, and the contact surface of measurement chip 64 is formed by those four protrusions 81, 82, 83, 84. That is, as shown in FIG. 5, measurement chip 64 is made so that any one of four protrusions 81, 82, 83, 84 will make contact with placement portion 100 and chip main body 80 will not come in contact with placement portion 100 even if placement portion 100 is not horizontal. Therefore, with measurement chip 64, it is possible to improve the accuracy of measuring the mounting position error.

Next, mark camera 48 is moved to a location above placement portion 100 by head moving device 62 and the placed measurement chip 64 is imaged. The amount of positional deviation of transparent windows 72 with respect to each of inspection reference marks 102, 104 is calculated from the captured image data. Component mounting head 30 then holds measurement chip 64 again and after rotating the suction nozzle 90 degrees around its axis, places measurement chip 64 on placement portion 100 again, and repeats the step of imaging with mark camera 48. Then, based on the imaging data, the positional deviation amount and the rotational position deviation amount at the time of component mounting is calculated. Finally, measurement chip 64 is returned to accommodation portion 90, thereby completing the measurement of the mounting accuracy of component mounting device 20.

As described above, when measuring the mounting accuracy, it is necessary to repeat the process of attaching and detaching measurement chip 64 with respect to placement portion 100. Measurement chip 64, as described above, may easily detach from placement portion 100 because only four protrusions 81, 82, 83, 84 are to adhere to placement portion 100 as compared with a measurement chip whose entire lower surface adheres to placement portion 100.

Measurement chip 64 of the present embodiment is provided with four protrusions, but the number is not limited thereto. If the area to be adhered to placement portion 100 is fixed to a minimum area, one protrusion is sufficient. In the case in which multiple protrusions are provided, placement portion 100 can be mounted in a stable manner if three or more protrusions are provided. Furthermore, it is desirable to match the center of gravity position of the contact surface formed by the multiple protrusions with the center of gravity position of the contact side surface of the chip main body.

Further, in measurement chip 64 of the present embodiment, protrusions 81, 82, 83, 84 are formed in flat plate shapes by screen printing, but when three or more protrusions are formed, the protrusions may be, for example, hemispherical protrusions. If the protrusion is such a protrusion, the possibility of detaching from placement portion 100 is further facilitated since the area to be adhered to placement portion 100 is further reduced.

REFERENCE SIGNS LIST

10: Component mounting machine, 12: Base, 14: Board conveyance and fixing device, 16: Feeder-type component supply device, 18: Tray-type component supply device, 20: Component mounting device [mounting device], 22: Part camera, 30: Component mounting head, 32: Head moving device, 48: Mark camera, 60: Mounting accuracy measurement kit, 62: Measurement table, 64: Mounting accuracy measurement chip, 70: Shape, 72: View window, 80: Chip main body, 81: First protrusion, 82: Second protrusion, 83: Third protrusion, 84: Fourth protrusion, 90: Accommodation portion, 100: Placement portion, 100, 102: Inspection reference mark

The invention claimed is:

1. A mounting accuracy measurement chip used to measure the mounting accuracy of a mounting device configured to mount a mounting member to a target mounting substrate, the mounting accuracy measurement chip comprising:
   a chip main body;
   one or more protrusions, provided on a mounting face of the chip main body, which serve as a contact surface with a mounting target at a position shifted from the mounting face of the chip main body, the one or more protrusions extending from the mounting face of the chip main body along a thickness direction of the chip main body, the one of more protrusions being made of resin; and
   a plurality of transparent windows,
   wherein the one or more protrusions are disposed only within a range defined by a circle, a center of the circle is a center of gravity of the mounting face and a radius of the circle is half a length of a longest distance from the center of gravity to an outer edge of the chip main body, and
   wherein each of the one or more protrusions is provided between two adjacent transparent windows of the plurality of transparent windows.

2. The mounting accuracy measurement chip of claim 1, wherein the mounting accuracy measurement chip has multiple protrusions.

3. The mounting accuracy measurement chip of claim 2, the mounting accuracy measurement chip comprising: four protrusions, including a first protrusion, a second protrusion, a third protrusion, and a fourth protrusion;
   wherein the four protrusions are provided such that the first protrusion and the second protrusion are positioned symmetrically with respect to a line segment connecting the third protrusion and the fourth protrusion, and the third protrusion and the fourth protrusion are positioned symmetrically with respect to a line segment connecting the first protrusion and the second protrusion.

4. A mounting accuracy measurement kit, comprising:
   the mounting accuracy measurement chip of claim 1; and
   an adhesive placement portion to which the contact surface of the mounting accuracy measurement chip adheres.

* * * * *